(12) United States Patent
Watzenberger et al.

(10) Patent No.: US 6,534,681 B1
(45) Date of Patent: Mar. 18, 2003

(54) METHOD FOR PREPARING HIGHLY STABILIZED HYDROXYLAMINE SOLUTIONS

(75) Inventors: Otto Watzenberger, Mannheim (DE); Hans Jörg Wilfinger, Schifferstadt (DE)

(73) Assignee: BASF Aktiengesellschaft, Ludwigshafen (DE)

( * ) Notice: Subject to any disclaimer, the term of this patent is extended or adjusted under 35 U.S.C. 154(b) by 0 days.

(21) Appl. No.: 10/048,555

(22) PCT Filed: Aug. 3, 2000

(86) PCT No.: PCT/EP00/07542

§ 371 (c)(1),
(2), (4) Date: Feb. 4, 2002

(87) PCT Pub. No.: WO01/10777

PCT Pub. Date: Feb. 15, 2001

(30) Foreign Application Priority Data

Aug. 4, 1999 (DE) .......................................... 199 36 594

(51) Int. Cl.⁷ ............................................... C01B 21/14
(52) U.S. Cl. ............................................ 564/2; 564/301
(58) Field of Search ...................... 564/2, 301

(56) References Cited

U.S. PATENT DOCUMENTS

| | | | | |
|---|---|---|---|---|
| 3,661,996 A | * | 5/1972 | Bader et al. ................. | 260/584 |
| 4,147,623 A | | 4/1979 | Koff et al. ..................... | 210/31 |
| 5,472,679 A | | 12/1995 | Levinthal et al. ........... | 423/387 |
| 5,788,946 A | | 8/1998 | Riddle et al. ................ | 423/387 |
| 5,872,295 A | | 2/1999 | Michelotti et al. .......... | 564/301 |

FOREIGN PATENT DOCUMENTS

| | | |
|---|---|---|
| WO | WO 97/22551 | 6/1997 |
| WO | WO 98/57886 | 12/1998 |
| WO | WO 99/42434 | 8/1999 |

* cited by examiner

Primary Examiner—Brian Davis
(74) Attorney, Agent, or Firm—Keil & Weinkauf

(57) ABSTRACT

The present invention relates to a process for the preparation of high-purity, stabilized hydroxylamine solutions in which an aqueous hydroxylamine starting solution is treated with an anion exchanger which has been pre-loaded with a hydroxylamine stabilizer in order to remove anions.

7 Claims, No Drawings

METHOD FOR PREPARING HIGHLY STABILIZED HYDROXYLAMINE SOLUTIONS

The present invention relates to a process for the preparation of high-purity, stabilized hydroxylamine solution (HA solutions) in which an aqueous hydroxylamine starting solution is treated with an anion exchanger in order to remove anions.

High-purity, concentrated, aqueous hydroxylamine solutions are used, inter alia, in the electronics industry, for example for the pre-cleaning of printed circuit boards. For use in the electronics industry, concentrations of impurities, for example anions, of less than 10 ppm are usually required in the starting materials employed, such as solutions, substances and other agents. Starting materials of such high purity are referred to as "electronics grade" products. However, the aqueous hydroxylamine solutions currently commercially available contain impurities from production, for example sodium sulfate, in the 30 ppm range.

One way of purifying aqueous hydroxylamine solutions is described in U.S. Pat. No. 5,872,295, in which the hydroxylamine solution is passed firstly over at least one strongly acidic ion exchanger which has been treated in advance with dilute hydrochloric acid and then over at least one strongly basic anion exchanger which has been pretreated or regenerated using a non-metallic amino or hydroxide base solution. The HA solution obtained in this way, which has been subjected to double exchange treatment, is then mixed with a stabilizer. The resultant HA solution is thus post-stabilized. Apart from the additional effort associated therewith, this gives rise to the problem that the stabilizer contains metal ions, in particular sodium, in relatively large amounts—about 1 ppm—from its preparation process. Since E grade chemicals must be primarily free from metal ions, post-stabilization of this type is ruled out since sodium ions would be re-introduced thereby.

U.S. Pat. No. 5,788,946 discloses a similar process for the purification of hydroxylamine which results in a significant reduction in respect of the content of cations and anions. In this process a solution of hydroxylamine is passed through at least one strongly acidic ion exchanger bed which has been treated in advance with a dilute hydrochloric acid, and subsequently through at least one bed of a strongly basic anion exchanger resin. The aqueous hydroxylamine solution obtained in this known process is not stabilized. If the hydroxylamine solution were to be post-stabilized, the problems already mentioned above would again occur.

U.S. Pat. No. 4,147,623 discloses a process for the removal of hydroxylamine from an aqueous hydroxylammonium salt solution; the solution contains cation salts whose respective corresponding free bases have dissociation constants of $>10^{-7}$. These salts also include the above-mentioned sodium sulfate. In accordance with this known process, the starting solution employed is firstly adjusted to a pH of from 6 to 11, subsequently passed through a bed of a strongly ionic exchanger resin, which can be a cation exchanger resin or an anion exchanger resin. Under these conditions, the majority of the hydroxylamine ions are transformed into electrically neutral hydroxylamine molecules, whereas the other salts present in the solution are essentially unaffected. If the solution is thus passed through the cation or anion exchanger, the electrically uncharged hydroxylamine is retained in the exchanger resin, while the salts are the first to leave the column in the eluate. The solution obtained in accordance with this prior art is likewise not stabilized and would have to be post-stabilized as already mentioned above. Thus, the problems already discussed above would again arise here.

PCT/EP99/00993 describes the preparation of essentially metal ion-free hydroxylamine solutions by treatment with an acidic cation exchanger.

Another purification method is distillative work-up of hydroxylamine solutions as described in U.S. Pat. No. 5,472,679. However, it must be ensured during the distillation that a temperature of 65° C. is not exceeded since the onset temperature, i.e. the temperature at which recognizable decomposition begins, is about 70° C. in the case of a 50% strength hydroxylamine solution. Alternative distillation methods are described in WO 97/22551 and WO 98/57886, the latter giving "electronics grade" hydroxylamine. A distillation, in particular at low temperatures and pressures, is associated with corresponding effort and time consumption. Accordingly, salt-free aqueous hydroxylamine solutions in electronics grade purity prepared in this way are correspondingly expensive and thus restricted in their use to a few areas of application.

It is an object of the present invention to provide a process for the preparation of stabilized, aqueous, high-purity hydroxylamine solutions which meet the requirements of electronics grade purity. In addition, the process should be less expensive than the process usual in the prior art. Finally, it should be possible to carry out the process without the risk of decomposition of the hydroxylamine.

We have found that this object is achieved by a process in which high-purity, stabilized hydroxylamine solutions are prepared by treating an aqueous anion-containing hydroxylamine starting solution with an anion exchanger loaded with a hydroxylamine stabilizer in order to remove the anions.

For the purposes of the present invention, the term "high-purity HA solutions" is taken to mean HA solutions whose content of anions, in particular sulfate ions, is below the quantitative detection limit, i.e. for example below 10 ppm. Preference is given to HA solutions whose content of cations (metal ions, in particular alkali metal ions, such as sodium ions) is less than 1 ppm, in particular less than 0.1 ppm.

The hydroxylamine starting solution used is generally an HA solution whose content of anions is up to 50 ppm, in general from 20 to 40 ppm of anions, in particular sulfate ions. The content of cations is generally up to about 50 ppm, in particular up to 30 ppm. The hydroxylamine concentration of such solutions is generally in the range from 1 to 70% by weight, in particular from 5 to 60% by weight. The preparation of HA solutions of this type is known to the person skilled in the art and is described, for example, in WO 97/22551 and U.S. Pat. No. 5,472,679.

Suitable anion exchangers are weakly basic, but preferably strongly basic anion exchangers. Suitable anion exchangers are, for example, the Amberlite, Duolite and Purolite resins from Rohm & Haas, such as Amberlite IRA-400, IRA-402, IRA-904 and preferably IRA-92 and IRA-93, Duolite A-109 and Purolite A-600, A-400, A-300, A-850 and A-87, and the Lewatit resins from BAYER AG, such as Lewatit M 511. The base form of the anion exchanger can be generated using conventional bases, such as sodium hydroxide or potassium hydroxide, or ammonia.

In accordance with the invention, use is made of anion exchangers which have been loaded with a stabilizer. The anion exchangers are used in the hydroxyl form having a pH in the range from 8 to 14. In the case of a weakly basic anion exchanger, the pH is in the range from 8 to 12, in particular from 8 to 11, while in the case of a strongly basic anion exchanger the pH is in the range from 12 to 14, in particular from 13 to 14. Suitable stabilizers are those which are bound by an anion exchanger. These are, for example, thioglycolic acid, hydroxyanthraquinones, hydroxyquinolines, hydroxyquinaldines, the salts of ethylenediaminetetraacetic acid or N-hydroxylethylethylenediaminotriacetic acid, hydroxanoic acids, dipyridyl compounds, aminoquinolines or phenanthrolines.

Preferred stabilizers are the compounds of the formula

where

A is alkylene, alkenylene, alkynylene, cycloalkylene, cycloalkenylene, arylene, o-, m- or p-xylylene, a 5- or 6-membered saturated or unsaturated heterocyclic ring containing a nitrogen atom, where said radicals may have 1, 2 or 3 substituents selected, independently of one another, from alkyl, alkoxy or hydroxyl, or is

where

B and X are —$CH_2CH_2$— or —$CH_2CH_2CH_2$—, n is 10–50,000,

R is H, alkyl, an ethylene or propylene radical which is substituted by OH, $NH_2$, $NHCOR^5$ or COOH, CSSH, $CH_2CN$ or $CH_2PO_3H_2$, or a bridge to a nitrogen atom of another polyethyleneimine or polypropyleneimine chain, where the bridge is formed by —[NR—B]$_o$— or

where o and p, independently of one another, are 1–15, $R^5$ is H, $C_1$–$C_{18}$-alkyl or $CHR^6COR^6$, where $R^6$ is a $C_{12}$–$C_{18}$-alkyl radical, $R^1$, $R^2$, $R^3$ and $R^4$, independently of one another, are H, $CH_2COOH$, $CH_2PO_3H_2$, alkyl, acyl, $CH_2CH_2OH$, $CH_2CH_2NH_2$ or

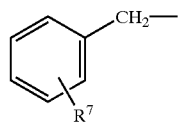

where $R^7$ is OH, SH, $NH_2$, CN, COOH, alkyl or alkoxy, or the salts thereof.

These stabilizers are described in U.S. Pat. No. 5,783,161, the disclosure content of which is incoprorated herein in its full scope by way of reference.

Particularly preferred stabilizers are cis- or trans-1,2-diamino-$C_5$–$C_6$-alkyl-N,N,N',N'-tetraacetic acid; N,N'-di(2-hydroxybenzyl)ethylenediamine-N,N'-diacetic acid; diethylenetriaminepentaacetic acid; ethylenebis(oxyethylenenitrilo)tetraacetic acid, cis- or trans-1,4-diaminocyclo-$C_5$–$C_6$-alkyl-N,N,N',N'-tetraacetic acid; bishexamethylenetriaminepentaacetic acid; hexamethylenediaminetetraacetic acid; tris(2-aminoethyl)aminehexaacetic acid; iminodiacetic acid and polyethyleneimine.

The loading of the anion exchanger with the stabilizer can be carried out in a conventional manner. To this end, the anion exchanger is treated with a solution of the stabilizer. For this purpose, the stabilizer is dissolved in water or an aqueous hydroxylamine solution, which generally has a content of up to 70% by weight, in particular from 10 to 50% by weight, of hydroxylamine. A solution of the stabilizer in a hydroxylamine solution which has approximately the same concentration as the hydroxylamine solution subsequently to be treated for removal of the anions is preferably used. The stabilizer solution generally contains from 1 to 20% by weight, in particular from 2 to 8% by weight, of the stabilizer.

For the loading, the anion exchanger is brought into contact with the stabilizer solution, for example by treatment in a reaction vessel with stirring. Preferably, however, the stabilizer solution is added via a bed of the anion exchanger, for example a column charged with the anion exchanger.

The treatment of the HA solution to be purified with the anion exchanger loaded with stabilizer is carried out in an analogous manner, i.e. the anion exchanger is brought into contact, with stirring, with the hydroxylamine solution to be purified, for example by treatment in a reaction vessel passed over a bed of the anion exchanger, for example a column charged with the anion exchanger.

The temperature at which the treatment is carried out is not crucial. In view of the sensitivity of the hydroxylamine, however, elevated temperatures will be avoided. In general, the treatment is carried out at a temperature in the range from 0° C. to about 70° C., preferably from 20 to 40° C.

The mixing ratio of the HA solution to be purified and loaded anion exchanger depends on the amount of anions to be removed. The person skilled in the art can determine the suitable amount in a simple manner by monitoring the purifying effect.

The process according to the invention can be carried out continuously or batchwise. The continuous procedure is preferred.

The treatment according to the invention of the hydroxylamine solution with a basic anion exchanger loaded with stabilizer can be combined with cation exchanger treatment. The treatment with the cation exchanger can be carried out before or after the treatment with the anion exchanger. This can be a weakly acidic cation exchanger having a pH in the acid form in the range from 2 to 6, in particular from 3 to 6. Cation exchangers containing chelating groups, such as iminodiacetic acid groups, are also suitable.

Suitable weakly acidic cation exchangers are, for example, the Lewatit TP grades from Bayer, such as Lewatit TP 207, the Amberlite IRC grades, Duolite C 433 etc., Dowex CCR or MWC and the like. The cation exchangers are used in the acid form. If necessary, they are for this purpose treated with an acid, for example sulfuric acid, in order to remove the cation, then usually rinsed with high-purity water until acid-free.

The treatment of the hydroxylamine solution can also be carried out with a strongly acidic cation exchanger in the acid form, i.e. a cation exchanger having a pH in the acid form in the range from 0 to 2, in particular from 0 to 1. Suitable strongly acidic cation exchangers are, for example, the resins Amberlite IR-120, IR-122, IRC-50 and Amberjet 1500H from Rohm & Haas, Dowex 88 from Dow Chemical, Duolite C-200, C-26 and C-280 from Rohm & Haas, and Purolite C-100, C-105 and C-150. The acid form can be generated using conventional strong acids, such as hydrochloric acid or sulfuric acid.

The treatment with the cation exchanger is carried out in an analogous manner to the treatment with the anion exchanger. Further details on the treatment with the cation exchanger are given in DE 198 06 578.7, which is incorporated herein by way of reference.

The treatment of the HA solution with the stabilized anion exchanger avoids the stabilizer being bound to the anion exchanger and the purified hydroxylamine solution having a depleted stabilizer content or even being free from stabilizer. The risk of decomposition associated with the process of the prior art is therefore reduced.

Preferably, the stabilizer is added to the aqueous hydroxylamine starting solution itself. This solution generally contains from 0.001 to 10% by weight, preferably from 0.01 to 5% by weight, in particular from 0.02 to 2% by weight, of stabilizer, based on hydroxylamine. Neither during the treatment with the anion exchanger nor during the treatment with the cation exchanger does a reduction in the stabilizer concentration then occur. Instead, the stabilizer concentrations remains essentially unchanged. This is of crucial importance since the stability and the shelf life of the purified hydroxylamine solution is determined essentially by the content of stabilizer. Only on maintenance of narrow concentration limits for the stabilizer is safe handling of the product ensured.

With the aid of the process according to the invention, both anions and cations can be removed from the hydroxylamine solution so substantially that the hydroxylamine solution has electronics grade quality.

The examples below illustrate the invention without representing a limitation.

EXAMPLES

The stabilizer used in the examples was trans-1,2-diaminocyclohexane-N,N,N',N'-tetraacetic acid.

Comparative Example 1

50% strength by weight HA solution having a stabilizer content which corresponds to a content of organic carbon of 250 μg/kg of solution and an $SO_4^{2-}$-content of 30 ppm was conveyed at room temperature through a laboratory ion exchanger column (glass, L=50 cm, D=1.08 cm) at a loading of 4.0 l/h. The depth of the ion exchanger bed was 30 cm. The ion exchanger employed was the strongly basic anion exchanger Lewatit M511. The $SO_4^{2-}$-content of the solution treated in this way was <10 ppm (detection limit) However, the treatment also substantially removed the stabilizer. The content of the purified solution was only 40 μg of organic C/kg of solution. The removal of stabilizer greatly reduced the stability of the solution. The stability of the solution is usually expressed in terms of the gas liberation per time unit on storage of the solution at 100° C. The solution treated over the ion exchanger Lewatit M511 exhibited gas liberation increased by a factor of 5, i.e. the solution treated in this way is no longer sufficiently stable.

Comparative Examples 2 and 3

Comparative Example 1 was repeated using the strongly basic anion exchanger Amberlite IRA-900 (Comparative Example 2) and using the weakly basic anion exchanger Amberlite IRA 92 (Comparative Example 3). In both cases, the $SO_4^{2-}$-content was reduced to less than 10 ppm. However, the content of stabilizer also decreased to <40 μg of organic C/kg of solution.

Example 1

Comparative Example 1 was repeated. However, the anion exchanger Lewatit M511 was fully loaded with the stabilizer before commencing the experiment by passing stabilizer solution (about 5% strength by weight solution of trans-1,2-diaminocyclohexane-N,N,N',N'-tetraacetic acid in 50% strength by weight aqueous HA solution) over the exchanger. The HA solution was then passed over the anion exchanger pretreated in this way. During this, the $SO_4^{2-}$ ions were removed from about 30 ppm to less than 10 ppm (detection limit). After the treatment, the HA solution purified in this way had a content of organic C of 280 μg/kg of solution (starting solution: 250 μg/kg). Within the detection limits, this corresponds to the value of the starting solution, i.e. the pre-loading of the anion exchanger resulted in the stabilizer content in the solution remaining unchanged during the ion exchanger treatment.

The low $SO_4^{2-}$-solution obtained in this experiment was as stable as the starting solution. The gas liberation at 100° C. was identical with the starting solution within the limits of measurement accuracy.

We claim:

1. A process for the preparation of high-purity, stabilized hydroxylamine solutions by treating an aqueous, anion-containing hydroxylamine starting solution with an anion exchanger, which comprises using an anion exchanger which has been pre-loaded with a hydroxylamine stabilizer.

2. A process as claimed in claim 1, wherein a pre-stabilized, aqueous hydroxylamine starting solution is used.

3. A process as claimed in claim 1, wherein the stabilizer used is at least one compound of the formula $$R^1R^2N-A-NR^3R^4 \qquad (I)$$

where

A is alkylene, alkenylene, alkynylene, cycloalkylene, cycloalkenylene, arylene, o-, m- or p-xylylene, a 5- or 6-membered saturated or unsaturated heterocyclic ring containing a nitrogen atom, where said radicals may have 1, 2 or 3 substituents selected, independently of one another, from alkyl, alkoxy or hydroxyl, or is

where
B and X are —$CH_2CH_2$— or —$CH_2CH_2CH_2$—,
n is 10–50,000,
R is H, alkyl, an ethylene or propylene radical which is substituted by OH, $NH_2$, $NHCOR^5$ or COOH, CSSH, $CH_2CN$ or $CH_2PO_3H_2$, or a bridge to a nitrogen atom of another polyethyleneimine or polypropyleneimine chain, where the bridge is formed by $-[NR-B]_o$ or $CH_2CHOH\ CH_2-[O\ CH_2CH_2]_p\ CH_2CHOH\ CH_2-$ where o and p, independently of one another, are 1–15,
$R^5$ is H, $C_1$–$C_{18}$-alkyl or $CHR^6COR^6$, where $R^6$ is a $C_{12}$–$C_{18}$-alkyl radical, $R_1$, $R^2$, $R^3$ and $R^4$, independently of one another, are H, $CH_2COOH$, $CH_2PO_3H_2$, alkyl, acyl, $CH_2CH_2OH$, $CH_2CH_2NH_2$ or

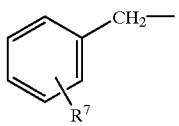

where
$R^7$ is OH, SH, $NH_2$, CN, COOH, alkyl or alkoxy or the salts thereof.

4. A process as claimed in claim 1, wherein the stabilizer used is at least one compound selected from the group consisting of cis-or trans-1,2-diaminocyclohexane-N,N,N',N'-tetraacetic acid; N,N'-di(2-hydroxybenzyl)-ethylenediamine-N,N'-diacetic acid; diethylenetriaminopentaacetic acid; ethylenebis(oxyethylenenitrilo)tetraacetic acid, cis- or trans-1,4-diaminocyclo-$C_5$–$C_6$-alkyl-N,N,N',N'-tetraacetic acid; bishexamethylenetriaminepentaacetic acid; hexamethylenediaminetetraacetic acid; tris(2-aminoethyl)aminehexaacetic acid; iminodiacetic acid and polyethyleneimine.

5. A process as claimed in claim 1, wherein a loaded, strongly basic anion exchanger is used.

6. A process as claimed in claim 1, wherein treatment with a cation exchanger is carried out before or after the treatment with the loaded anion exchanger.

7. A process for reducing the anion concentrations in aqueous hydroxylamine solutions, in which an aqueous hydroxylamine solution is treated with an anion exchanger which has been pre-loaded with a hydroxylamine stabilizer.

* * * * *